United States Patent
Yoneda et al.

(10) Patent No.: US 7,807,954 B2
(45) Date of Patent: Oct. 5, 2010

(54) LIGHT RECEIVING ELEMENT WITH UPPER AND SIDE LIGHT RECEIVING FACES AND AN OPTICAL SEMICONDUCTOR MODULE WITH THE LIGHT RECEIVING ELEMENT AND A LIGHT EMITTING ELEMENT MOUNTED ON THE SAME MOUNTING UNIT

(75) Inventors: Yoshihiro Yoneda, Yamanashi (JP); Ryuji Yamabi, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 14 days.

(21) Appl. No.: 12/059,232

(22) Filed: Mar. 31, 2008

(65) Prior Publication Data
US 2008/0237452 A1    Oct. 2, 2008

(30) Foreign Application Priority Data
Mar. 29, 2007  (JP) ............................ 2007-086131

(51) Int. Cl.
*G01J 1/42* (2006.01)
(52) U.S. Cl. ................. 250/208.2; 250/214.1; 257/431; 257/435; 257/437
(58) Field of Classification Search .............. 250/208.2, 250/214 R, 214.1; 257/431, 432, 435, 436, 257/437, 53
See application file for complete search history.

(56) References Cited

U.S. PATENT DOCUMENTS

| | | | | |
|---|---|---|---|---|
| 5,189,309 A | * | 2/1993 | Wada et al. | 257/21 |
| 5,783,839 A | * | 7/1998 | Morikawa et al. | 257/21 |
| 6,172,382 B1 | * | 1/2001 | Nagahama et al. | 257/94 |
| 6,909,083 B2 | * | 6/2005 | Matsuda | 250/214.1 |
| 2003/0122061 A1 | | 7/2003 | Kawano et al. | |
| 2003/0155626 A1 | * | 8/2003 | Ireland et al. | 257/437 |
| 2006/0110104 A1 | * | 5/2006 | Sakai | 385/33 |
| 2006/0273421 A1 | * | 12/2006 | Yasuoka et al. | 257/438 |
| 2006/0282070 A1 | * | 12/2006 | Arnold | 606/38 |

FOREIGN PATENT DOCUMENTS

| | | |
|---|---|---|
| JP | 57-160189 A | 10/1982 |
| JP | 59-96789 | 6/1984 |
| JP | 5-175614 | 7/1993 |
| JP | 10-321900 | 12/1998 |
| JP | 2000-151013 A | 5/2000 |

OTHER PUBLICATIONS

Chinese Office Action mailed Jul. 24, 2009, issued in corresponding Chinese Application No. 200810088364.4.
Chinese Office Action dated Feb. 12, 2010. issued in corresponding Chinese Patent Application No. 200810088364.4.

* cited by examiner

*Primary Examiner*—Thanh X Luu
*Assistant Examiner*—Francis M LeGasse, Jr.
(74) *Attorney, Agent, or Firm*—Westerman, Hattori, Daniels & Adrian, LLP

(57) ABSTRACT

An optical semiconductor module with a light receiving element with an upper and side light receiving face and a light emitting element mounted on the same mounting carrier. The light receiving element has a light receiving face on an upper face and a side face covered with an antireflection film. The mounting unit has the light emitting element and the light receiving element mounted so that they encompass a positional relationship that the light emitted from the light emitting element is optically connected at least on the light receiving face of the side face of the light receiving element.

16 Claims, 10 Drawing Sheets

LIGHT RECEIVING ELEMENT WITH UPPER AND SIDE LIGHT RECEIVING FACES AND AN OPTICAL SEMICONDUCTOR MODULE WITH THE LIGHT RECEIVING ELEMENT AND A LIGHT EMITTING ELEMENT MOUNTED ON THE SAME MOUNTING UNIT

BACKGROUND OF THE INVENTION

1. Field of the Invention

The present invention generally relates to an optical semiconductor module and a light receiving element. More particularly, the present invention relates to an optical semiconductor module that includes a light emitting element and a light receiving element, and to the light receiving element.

2. Description of the Related Art

An optical semiconductor module having a light emitting element such as a semiconductor laser mounted thereon is normally used for optical communications and the likes. For example, in an optical semiconductor module to be used for optical communications, the light emitted from a light emitting element is expected to have constant intensity. Therefore, such an optical semiconductor module includes a light emitting element and a light receiving element, and the light receiving element receives part of the light emitted from the light emitting element. The output of the light receiving element is fed back to the light emitting element, so as to maintain constant light emission of the light emitting element.

FIG. 1 is a schematic view of the above described conventional optical semiconductor module. A light emitting element 62 that is a laser diode (LD) chip is mounted on a module package 50 via a special-purpose mounting carrier 53. A light receiving element 80 that is a planar-type photodiode (PD) chip is mounted on the package 50 via a mounting carrier 51. An optical fiber 56 and a collecting lens 54 are fixed onto the package 50 via a fixing unit (not shown). The light emitting element 62 has an activation layer 66 that emits light. The light receiving element 80 has a light absorption layer 84 and a light transmission layer 85, and an impurity diffusion area 86 that is a light receiving area is formed in the light transmission layer 85.

Forward emitted light 70 that is emitted from the front side face 67 of the light emitting element 62 enters the optical fiber 56 through the collecting lens 54. Meanwhile, backward emitted light 72 is emitted from the rear side face 68, and enters the impurity diffusion area 86 of the light receiving element 80. The backward emitted light 72 is the light to be used for monitoring the light emission intensity of the forward emitted light 70. Therefore, the intensity of the backward emitted light 72 may be much lower than the intensity of the forward emitted light 70. The light receiving element 80 (a LD monitor) outputs an electric signal in accordance with the light intensity of the emitted light 72. Based on the electric signal, a control unit (not shown) controls the light emission intensity of the light emitting element 62. In this manner, the light emission intensity of the forward emitted light 70 can be maintained at a constant level.

Japanese Unexamined Patent Publication Nos. 5-175614 and 10-321900 disclose optical semiconductor modules. In each of the optical semiconductor modules, the mounting face of the light emitting element is parallel to the mounting face of the light emitting element, and the light emitted from the light emitting element is reflected and then enters the light receiving element. Japanese Unexamined Patent Publication No. 59-96789 discloses an optical semiconductor module in which the mounting face of the light emitting element is parallel to the mounting face of the light receiving element, and the light receiving element is mounted directly on the mounting face, which is different from the conventional structure shown in FIG. 1.

A light emitting element such as a LD emits light from a face that is a side face with respect to the mounting face (the face to be mounted on a mounting unit or the like). Meanwhile, a light receiving element such as a PD receives light through a face that is the upper face with respect to the mounting face. Therefore, in the conventional structure shown in FIG. 1, the light emitted from the rear side face 68 of the light emitting element 62 is received in the impurity diffusion area on the upper face of the light receiving element 80. To realize such a structure, the mounting face of the light receiving element 80 should be made perpendicular to the mounting face of the light emitting element 62. Therefore, the mounting carrier 53 of the light emitting element 62 needs to be prepared separately from the mounting carrier 51 of the light receiving element 80, as shown in FIG. 1. As a result, the number of assembling procedures, the number of required components, and the production costs increase accordingly.

In each of the structures disclosed in Japanese Unexamined Patent Publication Nos. 5-175614 and 10-321900, the light emitting element and the light receiving element can be mounted on the same mounting carrier. However, it is necessary to prepare a component that reflects the light emitted from the light emitting element. As a result, the production costs become higher. By the technique disclosed in Japanese Unexamined Patent Publication No. 59-96789, there is no need to prepare such a component, and the increase in production costs is not as large as that in the case of the conventional structure shown in FIG. 1. However, since the planar-type light receiving element is mounted parallel to the light emitting element, the photosensitivity becomes lower than that in the case of the conventional structure shown in FIG. 1. Furthermore, since extra light from the light emitting element enters through the light absorption layer outside the light receiving face, there is the problem that most of the incident light is not converted into electric signals.

SUMMARY OF THE INVENTION

It is therefore an object of the present invention to provide an optical semiconductor module and a light receiving element in which the above disadvantages are eliminated.

A more specific object of the present invention is to provide an optical semiconductor module and a light receiving element that can lower the production costs and can obtain photosensitivity as high as that of conventional structures.

According to an aspect of the present invention, there is provided an optical semiconductor module including: a light emitting element; a light receiving element that has a light receiving face on an upper face and a side face thereof, with an antireflection film being formed on the light receiving face; and a mounting unit that has the light emitting element and the light receiving element mounted thereon with such a positional relationship that light emitted from the light emitting element is optically connected at least on the light receiving face of the side face of the light receiving element. The light emitting element and the light receiving element can be mounted on the same mounting unit. Accordingly, the number of manufacturing procedures, the number of required components, and the production costs can be reduced, while higher photosensitivity is achieved.

According to another aspect of the present invention, there is provided a light receiving element that monitors light emitted from a light emitting element, the light receiving element including: a light receiving face that is formed on an upper face and a side face of the light receiving element, and has an antireflection film formed thereon. The light emitting element and the light receiving element can be mounted on the same mounting unit. Accordingly, it is possible to reduce the number of manufacturing procedures and the number of required components, and to lower the production costs. Furthermore, photosensitivity as high as the photosensitivity of a conventional structure can be maintained.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
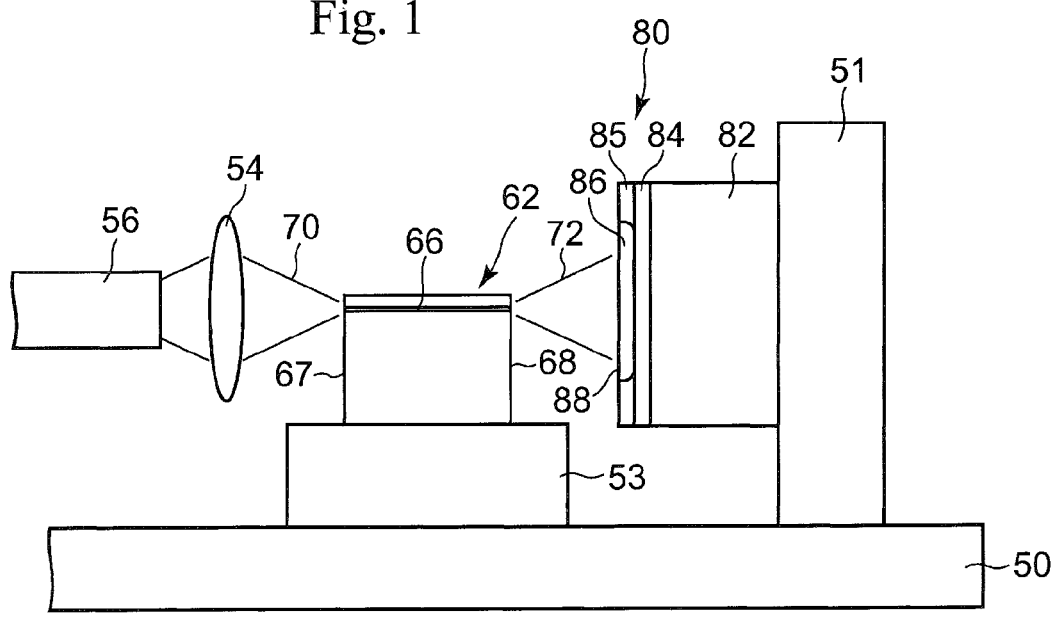
FIG. 1 is a schematic view of a conventional optical semiconductor module.

In a conventional structure such as the structure shown in FIG. 1, the light receiving element 80 is normally a planar-type light receiving element. In a planar-type light receiving element, the p-type impurity diffusion area 86 is formed in the light transmission layer 85 by an ion implantation technique and a diffusion technique, for example. Accordingly, the manufacture of planar-type light receiving elements is easier, and such light receiving elements are generally used for optical communications and LD monitoring. Meanwhile, the inventor discovered that, when a mesa-type light receiving element of the present invention was used as the light receiving element 80, it was possible to provide an optical semiconductor module that had a smaller number of assembling procedures, lower production costs, and excellent photosensitivity. The following is a description of the principles of such a light receiving element.

Figure 2:
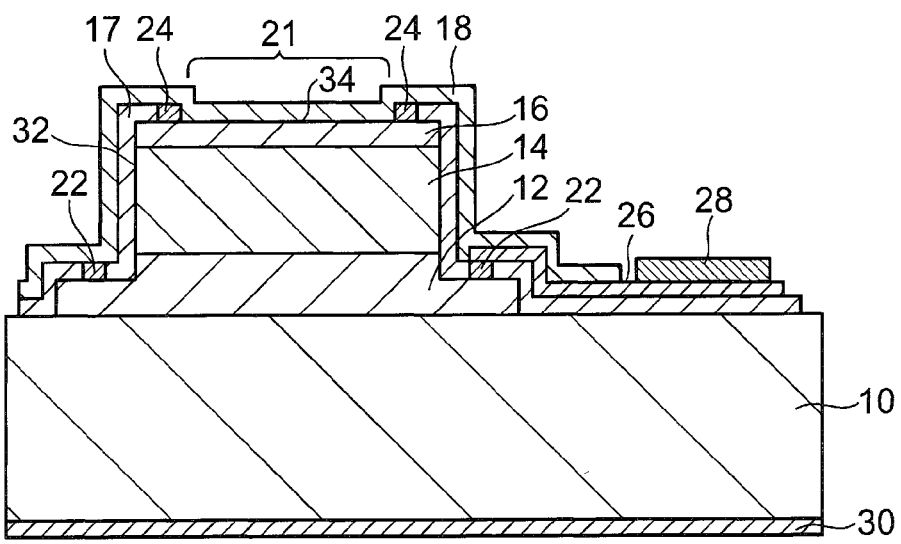
FIG. 2 is a cross-sectional view of a light receiving element.

FIG. 2 is a cross-sectional view of a mesa-type light receiving element. A semiconductor layer 12 that is made of n-type InGaAs (indium gallium arsenide) and is of a first conductivity type, a light absorption layer 14 made of i-InGaAs, and a semiconductor layer 16 that is made of p-type InGaAs and is of a second conductivity type (the opposite conductivity type of the first conductivity type) are stacked on an InP (indium phosphide) semi-insulating substrate 10. The peripheral portions of the stacked layers are removed as deep as the semiconductor layer 12 of the first conductivity type, so as to form a mesa. A first electrode 22 made of AuGe (gold germanium) is connected to the semiconductor layer 12 of the first conductivity type. A second electrode 24 made of AuZn (gold zinc) is connected to the semiconductor layer 16 of the second conductivity type. A protection film 17 made of SiN (silicon nitride) is formed outside a light receiving area 21 on an upper face 34, so as to be in contact with a side face 32, for example. An antireflection film 18 made of SiN is formed over the light receiving area 21 and the protection film 17. The first electrode 22 and the second electrode 24 are connected to pads 28 made of Au via interconnections 26 made of Ti(titanium)/Pt (platinum)/Au(gold) (the interconnection and pad connected to the second electrode 24 are not shown). A metal film 30 made of Ti/Pt/Au is formed under the lower face of the substrate 10.

The mesa-type light receiving element shown in FIG. 2 applies a voltage between the semiconductor layer 12 of the first conductivity type and the semiconductor layer 16 of the second conductivity type. The light incident on the light receiving area 21 is absorbed by the light absorption layer 14, and a current flows between the semiconductor layer 12 of the first conductivity type and the semiconductor layer 16 of the second conductivity type. This current is output as an electric signal.

In the mesa-type light receiving element, the semiconductor layer 12 of the first conductivity type and the semiconductor layer 16 of the second conductivity type also exist on and under the portion of the light absorption layer 14 located in the vicinity of the side face 32, as shown in FIG. 2. With this arrangement, the light incident on the light absorption layer 14 through the side face 32 can be converted into electric signals. In the case of a planar-type light receiving element, the impurity diffusion area 86 equivalent to the semiconductor layer 16 of the second conductivity type exists only on a part of the light transmission layer 85, as shown in FIG. 1. With this arrangement, even when light enters the light receiving element through a side face, most of the light incident on the light absorption layer 14 through the side face cannot be converted into electric signals, since the impurity diffusion area 86 does not exist on the portion of the light absorption layer 84 located in the vicinity of the side face.

In the mesa-type light receiving element, a decrease in dark current is required, so that the light receiving element can be used in a light receiving module. Therefore, the protection film 17 (a passivation film) for reducing leakage current is formed on the side face 32 of the mesa. With this arrangement, the light receiving area 21 is formed on the upper face 34 of the mesa, and even if the light receiving element is mounted in the same plane as a LD chip, sufficient photosensitivity for monitoring the LD cannot be obtained. Because of the above facts, it has been uncommon to use a mesa-type light receiving element as a LD monitor. To counter this problem, the inventor developed the light receiving element of the present invention, based on the following discoveries. In the case of a light receiving element as an optical monitor, a decrease in dark current is not expected as in the case of a light receiving element for receptions. Therefore, the protection film 17 is not employed, and the antireflection film 18 alone can complete the light receiving element as a monitoring element.

The principles of the present invention are that the light emitted from a side face of a light emitting element is received by a light receiving element that is capable of receiving light incident on a side face of a mesa. With this arrangement, the mounting faces of the light emitting element and the light receiving element can be set parallel to each other. Accordingly, the number of manufacturing procedures and the number of required components can be made smaller than in conventional cases, and the production costs can be lowered while sufficient photosensitivity is maintained. The following is a description of embodiments of the present invention.

First Embodiment

Figure 3:
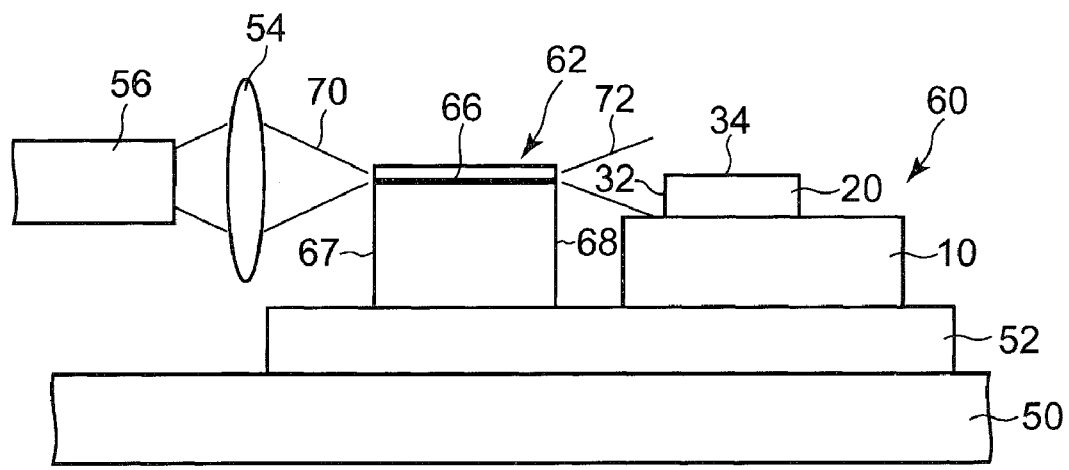
FIG. 3 is a schematic view of an optical semiconductor module in accordance with a first embodiment of the present invention.

FIG. 3 is a schematic view of an optical semiconductor module in accordance with a first embodiment of the present invention. A light emitting element 62 is a Fabry-Perot LD or a distributed-feedback LD, for example. A light receiving element 60 is a mesa-type light receiving element that will be described later in detail, and has a mesa formed on a substrate 10. Unlike the structure shown in FIG. 1, this optical semiconductor module has the light emitting element 62 and the light receiving element 60 mounted on a mounting carrier 52. The side face 32 of the light receiving element 60 receives backward light 72 emitted from a rear side face 68 of the light emitting element 62. The other aspects of this structure are the same as those of the structure shown in FIG. 1, and therefore, explanation of them is omitted here.

Figure 4:
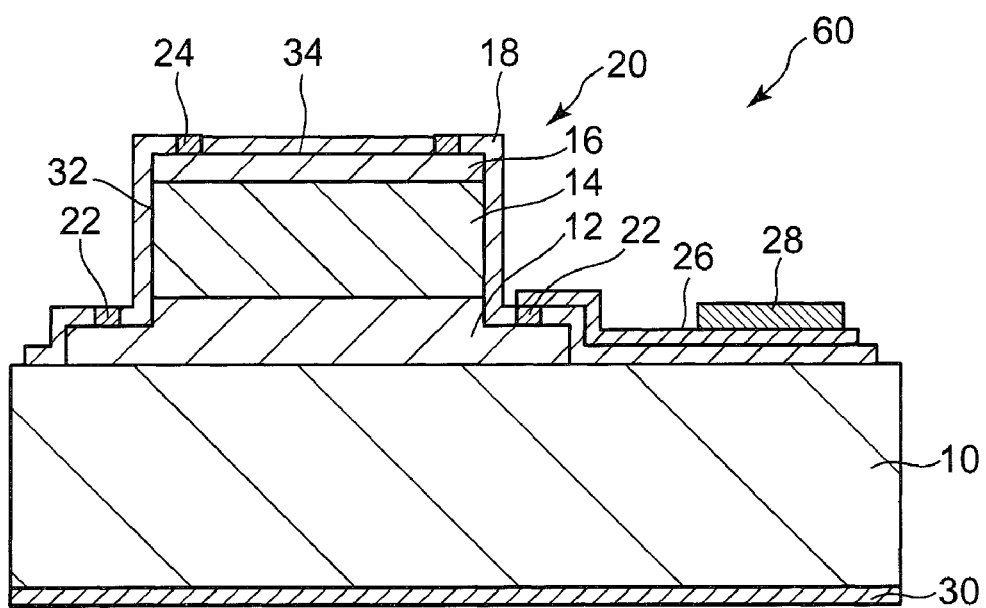
FIG. 4 is a cross-sectional view of a light receiving element in accordance with the first embodiment.

FIG. 4 is a cross-sectional view of the light receiving element 60 employed in the first embodiment. Unlike the light receiving element shown in FIG. 2, the light receiving element 60 does not have a protection film, but has an antireflection film 18 formed directly on the side face 32 and the upper face 34 of a mesa 20. The other aspects of this structure are the same as those of the structure shown in FIG. 2, and therefore, explanation of them is omitted here.

Figure 5A:
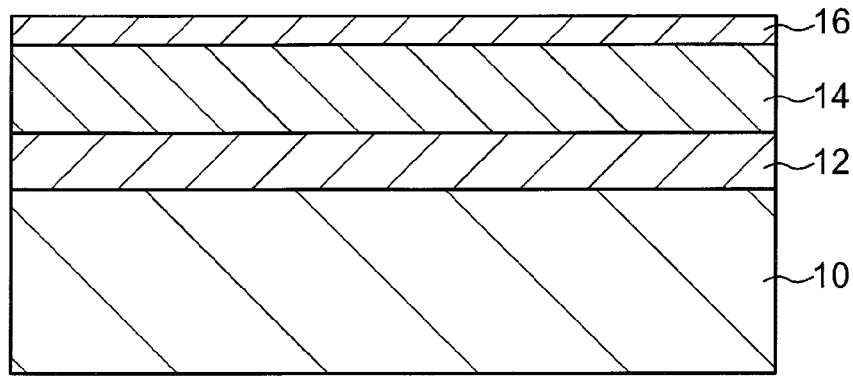
FIGS. 5A through 5C are cross-sectional views showing the procedures for manufacturing the light receiving element in accordance with the first embodiment.
Figure 5B:
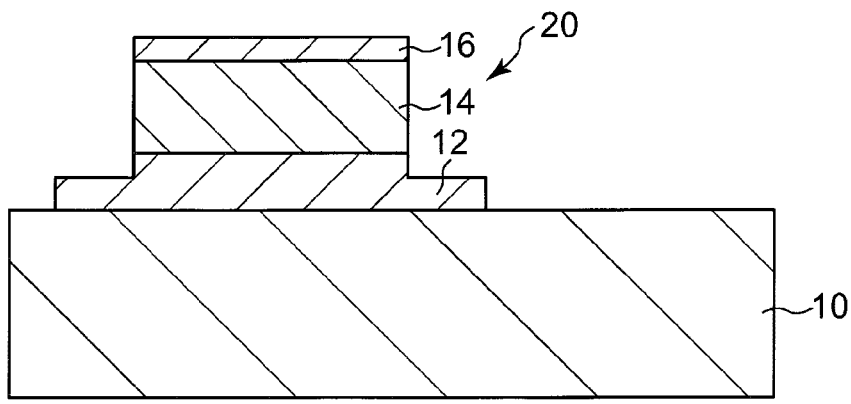
Figure 5C:
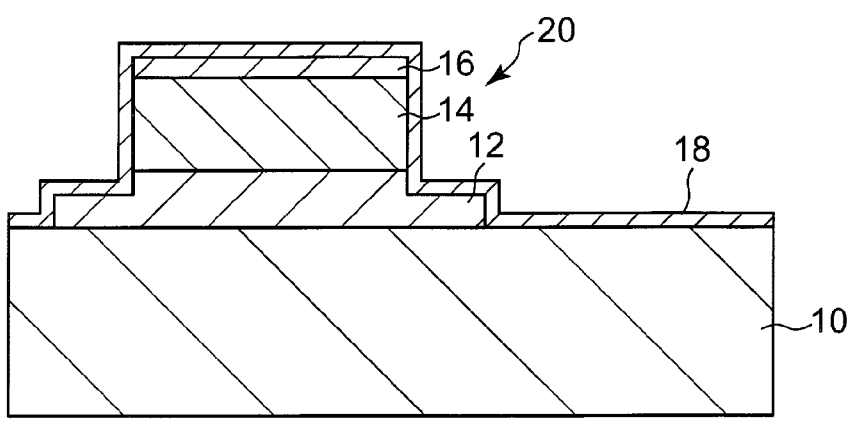

FIGS. 5A through 6C are cross-sectional views showing the procedures for manufacturing the light receiving element 60. As shown in FIG. 5A, the semiconductor layer 12 of the first conductivity type, the light absorption layer 14, and the semiconductor layer 16 of the second conductivity type are grown on the InP substrate 10 by MOCVD (Metal Organic Chemical Vapor Deposition). As shown in FIG. 5B, etching is performed on predetermined portions of the semiconductor layer 16 of the second conductivity type, the light absorption layer 14, and the semiconductor layer 12 of the first conductivity type, so as to form the mesa 20. As shown in FIG. 5C, the antireflection film 18 that has a film thickness of 100 nm to 300 nm and is made of SiN is formed by CVD.

Figure 6A:
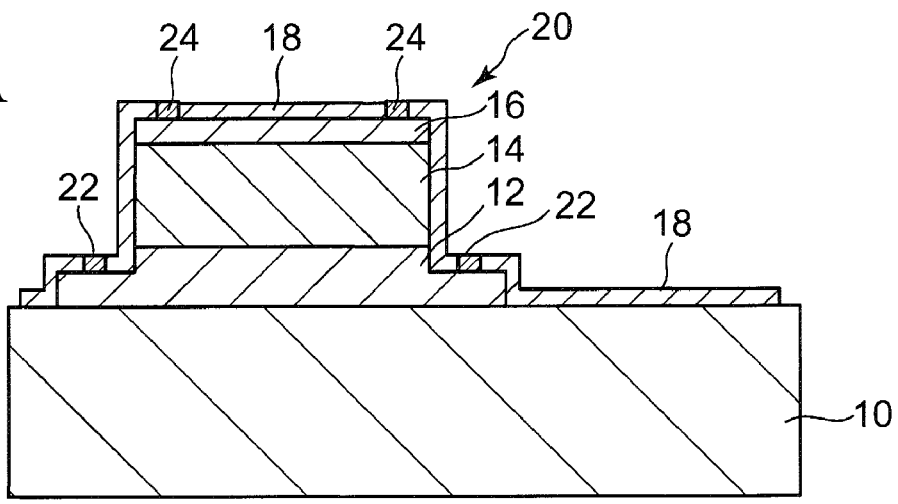
FIGS. 6A through 6C are cross-sectional views showing the procedures for manufacturing the light receiving element in accordance with the first embodiment (continued)
Figure 6B:
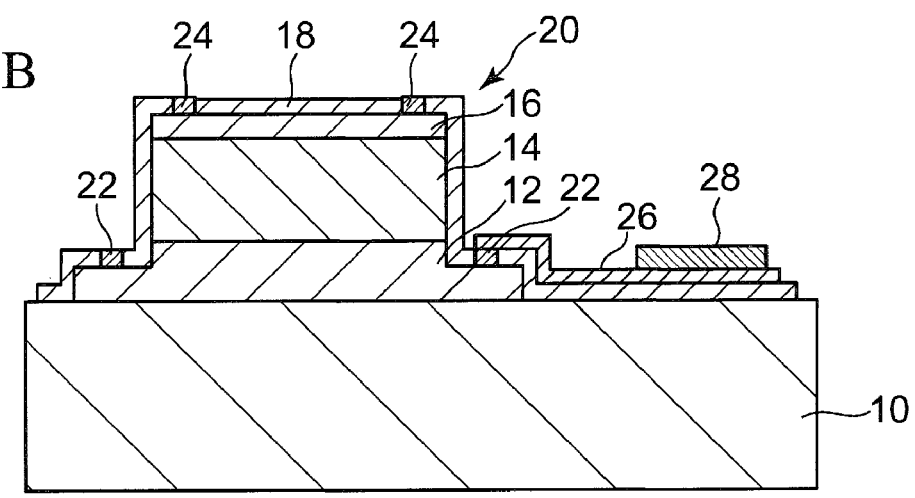
Figure 6C:
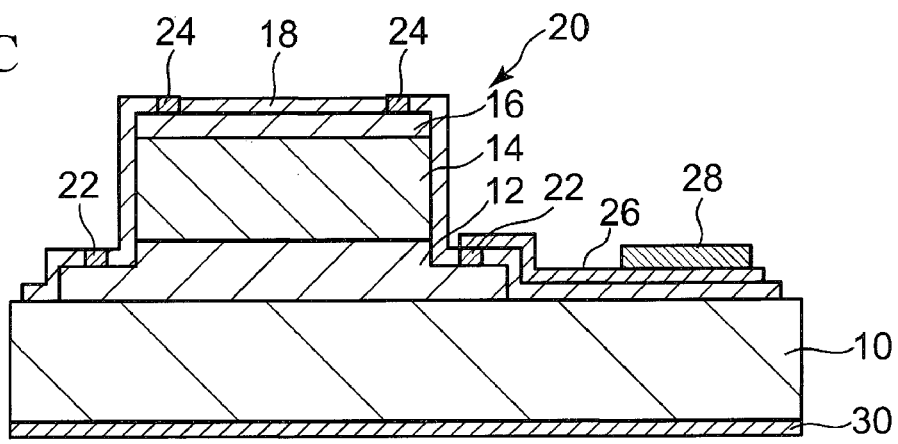

As shown in FIG. 6A, the first electrode 22 to be connected to the semiconductor layer 12 of the first conductivity type, and the second electrode 24 to be connected to the semiconductor layer 16 of the second conductivity type are formed by a vapor deposition technique. As shown in FIG. 6B, the interconnections 26 to be connected to the first electrode 22 and the second electrode 24 are formed by a vapor deposition technique. The pads 28 to be connected to the interconnections 26 are also formed by a plating technique. As shown in FIG. 6C, the substrate 10 is polished from below, and is made thinner. The metal film 30 is then formed under the bottom face by a vapor deposition technique. In this manner, the light receiving element 60 is completed.

Here, the differences between the light receiving element shown in FIG. 2 and the light receiving element shown in FIG. 4 are described. In the light receiving element shown in FIG. 2, the protection film 17 does not exist on the semiconductor layer 16 of the second conductivity type forming the upper face 34, but the antireflection film 18 is formed on the semiconductor layer 16 of the second conductivity type forming the upper face 34. This antireflection film 18 prevents reflection of light of a predetermined wavelength. However, the protection film 17 and the antireflection film 18 both exist on the side face 32. As a result, the predetermined-wavelength light incident on the side face 32 is reflected. In the light receiving element 60 shown in FIG. 4, on the other hand, the protection film 17 (a passivation film) is not formed, and accordingly, reflection of the predetermined-wavelength light incident on the side face 32 can be prevented. In FIG. 2, the protection film 17 is provided to reduce the dark current to be generated due to current leakage in the vicinity of the side face 32. The light receiving element 60 for monitoring a LD is not strict on dark current. Accordingly, the light receiving element 60 that does not have the protection film 17 as shown in FIG. 4 can be used as a light receiving element for monitoring a LD.

In the first embodiment, the optical semiconductor module has the light emitting element 62 that is mounted on the package 50 via the mounting carrier 52 (a mounting unit) and emits light from the side face 68, and the light receiving element 60 that is mounted on the package 50 via the mounting carrier 52 and receives the light emitted from the light emitting element 62 through the side face 32. More specifically, the light receiving element 60 has the antireflection film 18 formed on the upper face 34 and the side face 32. Accordingly, the light receiving element 60 has a light receiving face formed with the antireflection film 18 on the upper face 34 and the side face 32. The mounting carrier 52 as the mounting unit has the light emitting element 62 and the light receiving element 60 mounted thereon, with such a positional relationship being maintained that the light emitted from the light emitting element 62 is optically connected at least on the light receiving face on the side face 32 of the light receiving element 60. With this arrangement, the light emitting element 62 and the light receiving element 60 can be mounted on the same mounting carrier 52. Accordingly, the light emitting element 62 and the light receiving element 60 can be mounted on the same plane of the mounting carrier 52. Thus, the number of manufacturing procedures and the number of required components can be reduced, the production costs can be lowered, and higher photosensitivity can be obtained.

Also, as shown in FIG. 4, it is preferable that the semiconductor layer 12 of the first conductivity type and the semiconductor layer 16 of the second conductivity type of the light receiving element 60 are in contact with the side face 32. In other words, it is preferable that at least the semiconductor layer 16 of the second conductivity type extends onto the side face 32. With this arrangement, the light incident on the light absorption layer 14 through the side face 32 can be converted into electric signals. Therefore, a mesa-type light receiving element is preferred.

Second Embodiment

Figure 7A:
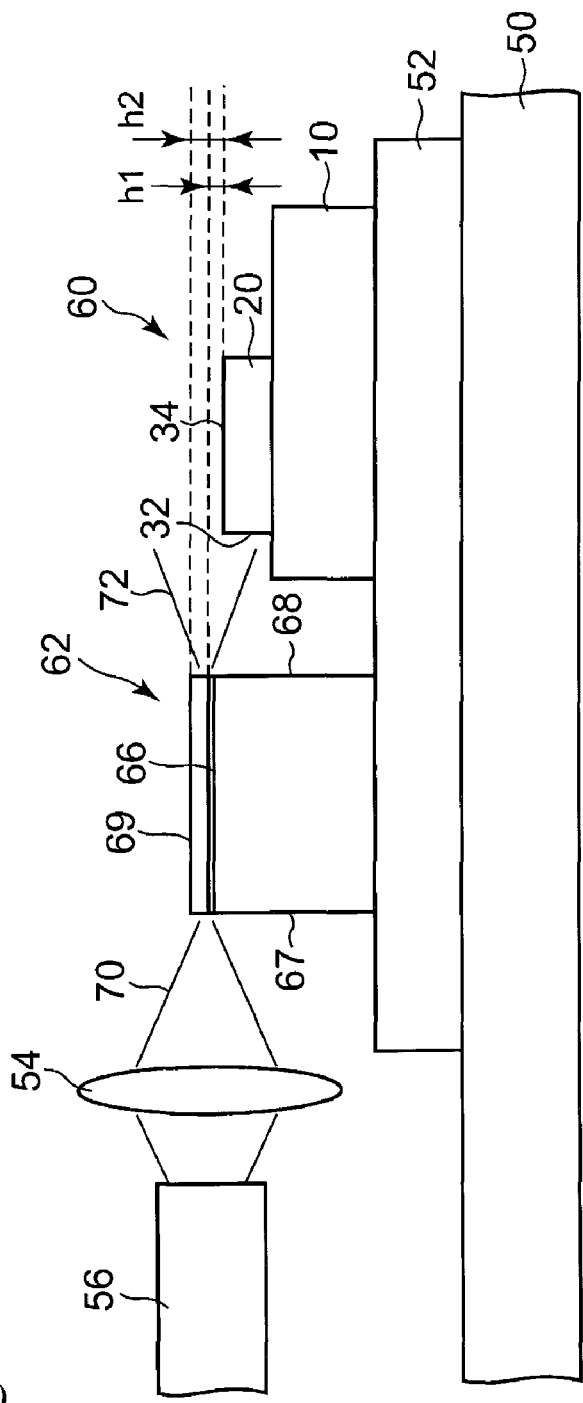
FIGS. 7A and 7B are schematic views of an optical semiconductor module in accordance with a second embodiment of the present invention.

FIG. 7A is a schematic view of an optical semiconductor module in accordance with a second embodiment of the present invention. Unlike the optical semiconductor module of the first embodiment shown in FIG. 3, for example, this optical semiconductor module has the upper face 34 of the light receiving element 60 at a lower level than an activation layer 66 of the light emitting element 62. The other aspects of this structure are the same as those of the structure shown in FIG. 3, and therefore, explanation of them is omitted here.

Figure 7B:
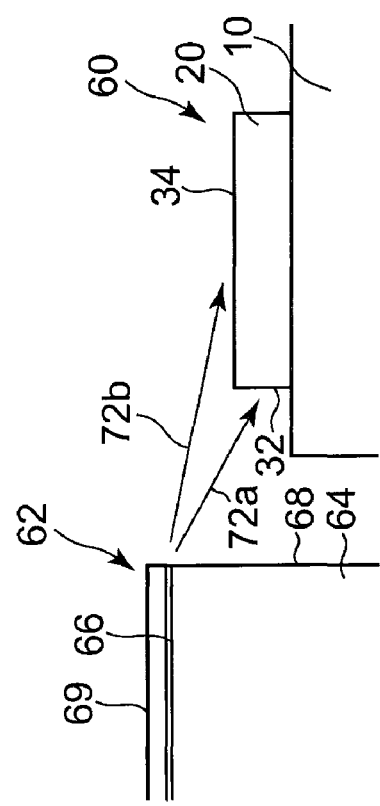

Since the upper face 34 of the light receiving element 60 is located at a lower level than the activation layer 66 of the light emitting element 62, the side face 32 of the light receiving element 60 can receive backward light 72a emitted from the rear side face 68 of the light emitting element 62, and the upper face 34 of the light receiving element 60 can receive backward emitted light 72b, as shown in FIG. 7B. With this arrangement, the sensitivity of the light receiving element 60 with respect to the backward emitted light 72 can be increased.

As in the second embodiment, it is preferable that the upper face 34 of the light receiving element 60 is located at a lower level than the activation layer 66 of the light emitting element 62. However, the activation layer 66 is only approximately 1 μm lower than the upper face 69 of the light emitting element 62. On the other hand, the thickness of each of the light emitting element 62 and the light receiving element 60 is approximately 100 μm. Accordingly, the height difference h1 between the activation layer 66 of the light emitting element 62 and the upper face 34 of the light receiving element 60 shown in FIG. 7A is substantially equal to the height difference h2 between the upper face 69 of the light emitting element 62 and the upper face 34 of the light receiving element 60. Therefore, in practice, the upper face 34 of the light receiving element 60 is lower at least than the upper face 69 of the light emitting element 62.

The thickness of the light emitting element 62 is normally 100 μm to 150 μm. Therefore, the thickness of the light receiving element 60 should preferably be 100 μm or less.

Third Embodiment

Figure 8:
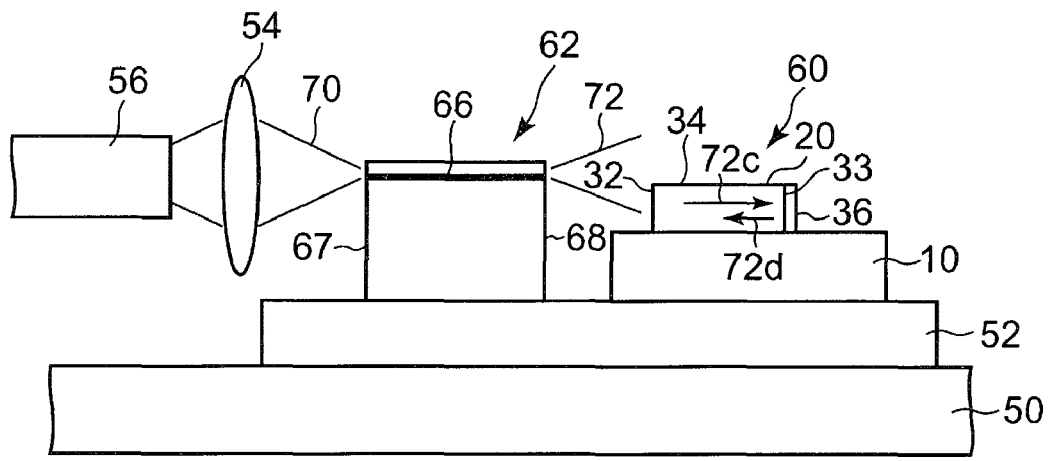
FIG. 8 is a schematic view of an optical semiconductor module in accordance with a third embodiment of the present invention.
Figure 9:
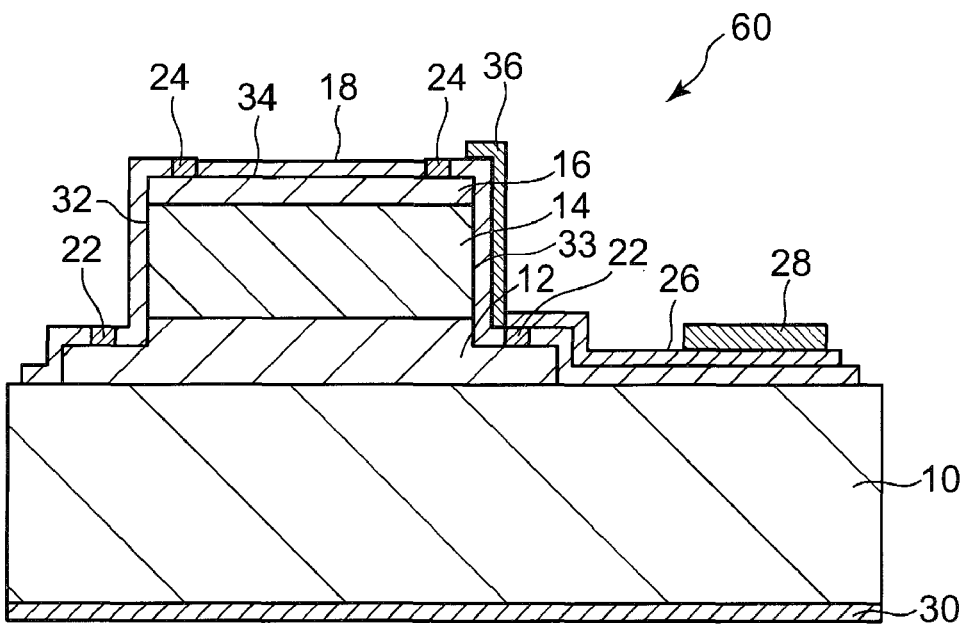
FIG. 9 is a cross-sectional view of a light receiving element in accordance with the third embodiment.

FIG. 8 is a schematic view of an optical semiconductor module in accordance with a third embodiment of the present invention. Unlike the optical semiconductor module of the first embodiment shown in FIG. 3, for example, this optical semiconductor module has a high-reflection film 36 (HR) formed on a side face 33 on the opposite side from the side face 32 through which the light 72 emitted from the light emitting element 62 facing the light receiving element 60 enters the light receiving element 60. FIG. 9 is a cross-sectional view of the light receiving element 60 shown in FIG. 8. Unlike the light receiving element shown in FIG. 4, this light receiving element 60 has the high-refection film 36 formed on the side face 33 on the opposite side from the side face 32 of the light receiving element 60. The high-reflection film 36 may be a film formed with a SiO₂ (silicon oxide) film of 200 nm to 300 nm in film thickness/a TiO₂ (titanium oxide) film of 100 nm to 200 nm in film thickness in this order from the side face, or a TiON (titanium oxynitride) of 50 nm to 200 nm in film thickness, a Si film of 50 nm to 200 nm in film thickness, a Au film of 100 nm to 200 nm in film thickness, a Ag film of 100 nm to 200 nm in film thickness, a AuGe film of 100 nm to 200 nm in film thickness, or the like. This high-reflection film 36 can be formed by a sputtering technique or a vacuum vapor deposition technique, for example. The other aspects of this structure are the same as those of the structure of the first embodiment shown in FIGS. 3 and 4, and therefore, explanation of them is omitted here.

In accordance with the third embodiment, light 72c traveling through the mesa 20 is reflected by the high-reflection film 36, as shown in FIG. 8. The light 72c is part of the light incident on the mesa 20 of the light receiving element 60. When traveling through the light absorption layer 14 again, the reflected light 72d is absorbed by the light absorption layer 14. Thus, the sensitivity of the light receiving element 60 with respect to the emitted light 72 can be increased.

Fourth Embodiment

Figure 10:
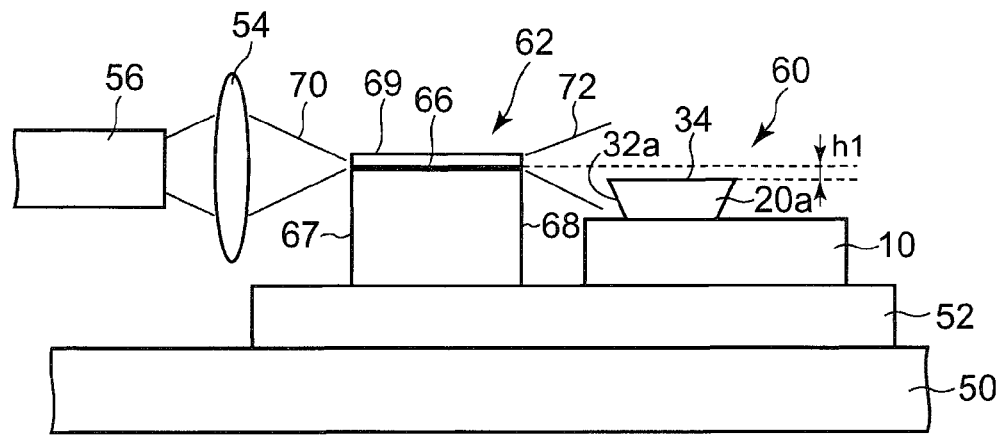
FIG. 10 is a schematic view of an optical semiconductor module in accordance with a fourth embodiment of the present invention.
Figure 11:
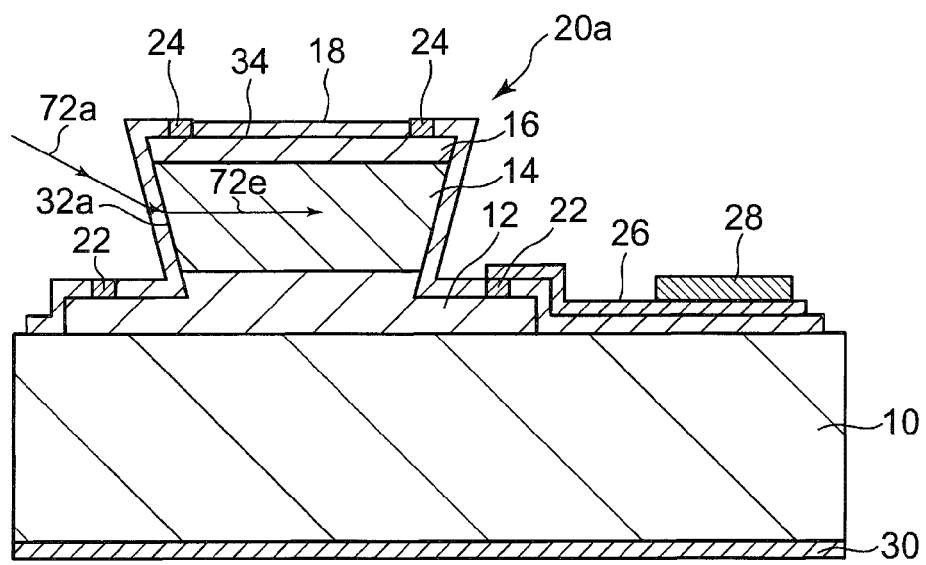
FIG. 11 is a cross-sectional view of a light receiving element in accordance with the fourth embodiment.

FIG. 10 is a schematic view of an optical semiconductor module in accordance with a fourth embodiment of the present invention. FIG. 11 is a cross-sectional view of a light receiving element in accordance with the fourth embodiment. Unlike the structures of the second and third embodiments shown in FIG. 7A and FIG. 8, respectively, this optical semiconductor module has a side face 32a of the light receiving element 60 formed in a reversed mesa shape. The other aspects of this structure are the same as those of the structures shown in FIGS. 7A and 8, and therefore, explanation of them is omitted here. A reversed mesa can be formed by wet etching, taking advantage of the crystal plane orientation.

In accordance with the fourth embodiment, the upper face 34 of the light receiving element 60 is located at a lower level than the upper face 69 of the light emitting element 62. Accordingly, light 72a traveling in a diagonally downward direction enters the light receiving element 60 through the side face 32a. Since the side face 32a is in a reversed mesa shape, refracted light 72e incident on the light absorption layer 14 travels substantially in the horizontal direction. Accordingly, the light 72e takes a long time to pass through the light absorption layer 14, and the light absorption layer 14 easily absorbs the light 72e. Thus, the sensitivity of the light receiving element 60 with respect to the emitted light 72a can be further increased. Here, it is preferable that the angle of the reversed mesa is determined based on the distance between the light receiving element 60 and the light emitting element 62, the height h1, the refraction index of the light absorption layer 14, and the likes.

Fifth Embodiment

Figure 12:
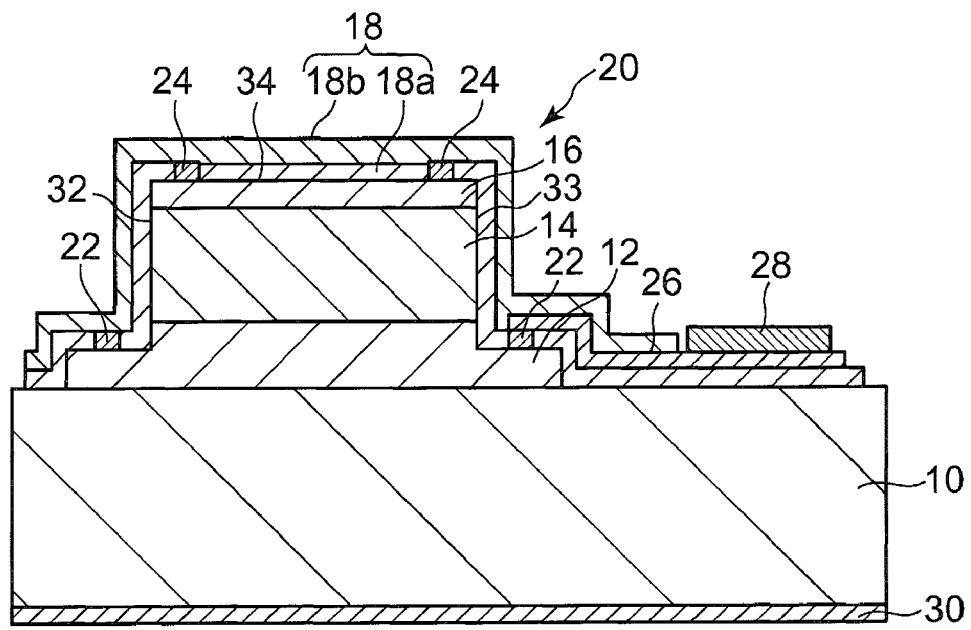
FIG. 12 is a cross-sectional view of a light receiving element in accordance with a fifth embodiment of the present invention.
Figure 13:
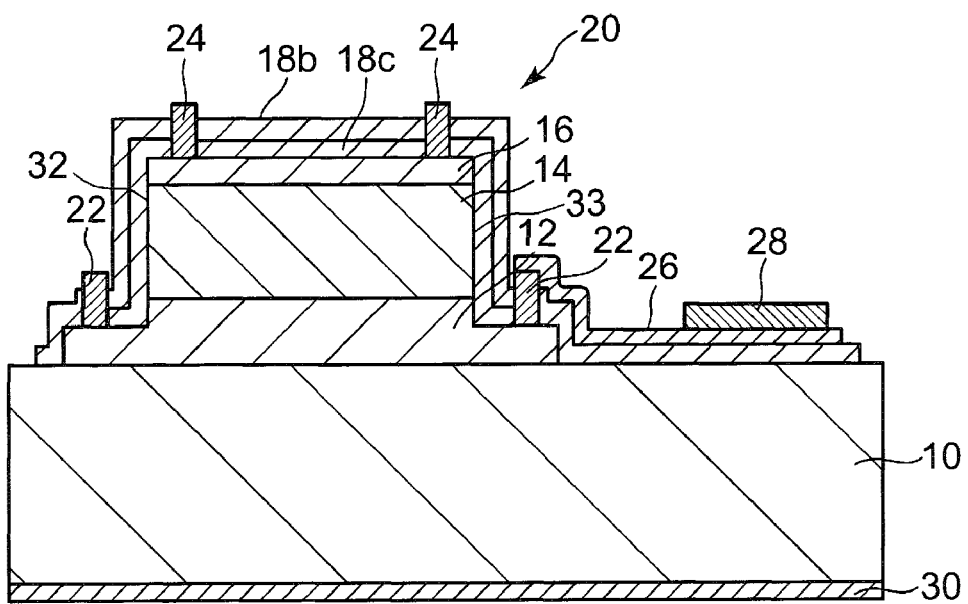
FIG. 13 is a cross-sectional view of a light receiving element in accordance with a modification of the fifth embodiment.

FIG. 12 is a cross-sectional view of the light receiving element 60 of an optical semiconductor module in accordance with a fifth embodiment of the present invention. Unlike the antireflection film of the first embodiment shown in FIG. 4, the antireflection film 18 is formed with two layers: a protection film 18a that is a SiO₂ film of 50 nm to 200 nm in film thickness, and an adjusting film 18b that is a SiN film of 50 nm to 200 nm in film thickness. The protection film 18a is a film that protects the side faces 32 and 33, and prevents leakage current between the semiconductor layer 12 of the first conductivity type and the semiconductor layer 16 of the second conductivity type. The adjusting film 18b is a film that adjusts the wavelength of incident light so that the antireflection film 18 has the function of preventing reflection. With this arrangement, the protection film 18a can prevent the above mentioned leakage current, like the protection film 17 of the light receiving element shown in FIG. 2. Further, the protection film 18a and the adjusting film 18b cooperate with each other to prevent reflection of light of a predetermined wavelength. FIG. 13 illustrates a modification of the fifth embodiment. Unlike the protection film 18a of the fifth embodiment shown in FIG. 12, a protection film 18c is made of i-InP. As described above, the antireflection film 18 should preferably be in contact with the portions of the light absorption layer 14 located on the side faces 32 and 33. The antireflection film 18 may be a single-layer film as in the first embodiment, and may be a multilayer film formed with two or more layers as in the fifth embodiment. Also, the protection film 18a (18c) in the antireflection film 18 may be an insulating film as in the fifth embodiment, and may be a semiconductor film as in the modification of the fifth embodiment.

Sixth Embodiment

Figure 14:
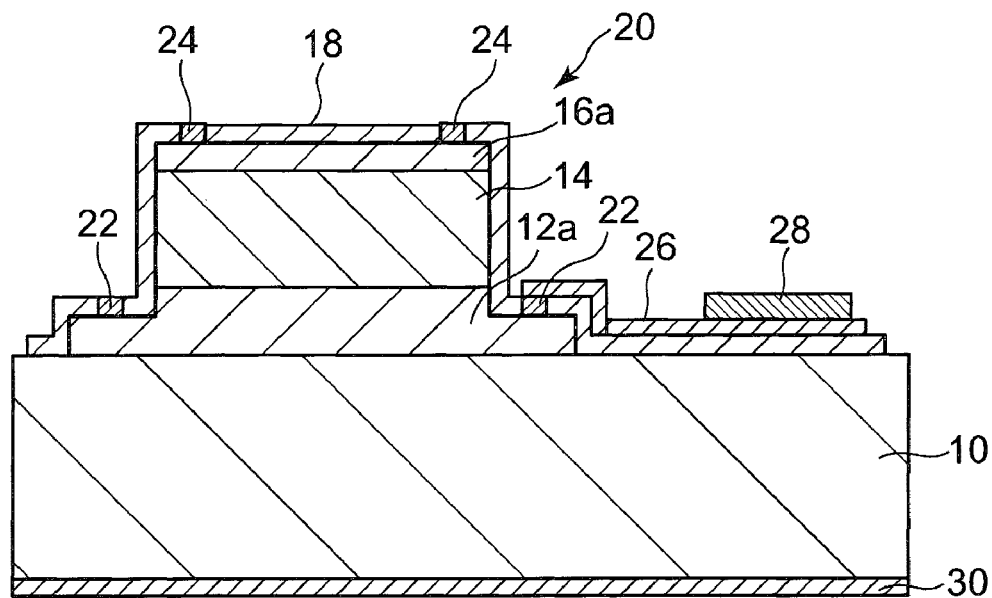
FIG. 14 is a cross-sectional view of a light receiving element in accordance with a sixth embodiment of the present invention.

FIG. 14 is a cross-sectional view of the light receiving element 60 of an optical semiconductor module in accordance with a sixth embodiment of the present invention. This embodiment differs from the first embodiment shown in FIG. 4 in that a semiconductor layer 12a of the first conductivity type is made of n-type InP, and a semiconductor layer 16a of the second conductivity type is made of p-type InP. As in the sixth embodiment, the materials of the light receiving element 60 and the light emitting element 62 can be arbitrarily selected.

Seventh Embodiment

Figure 15:
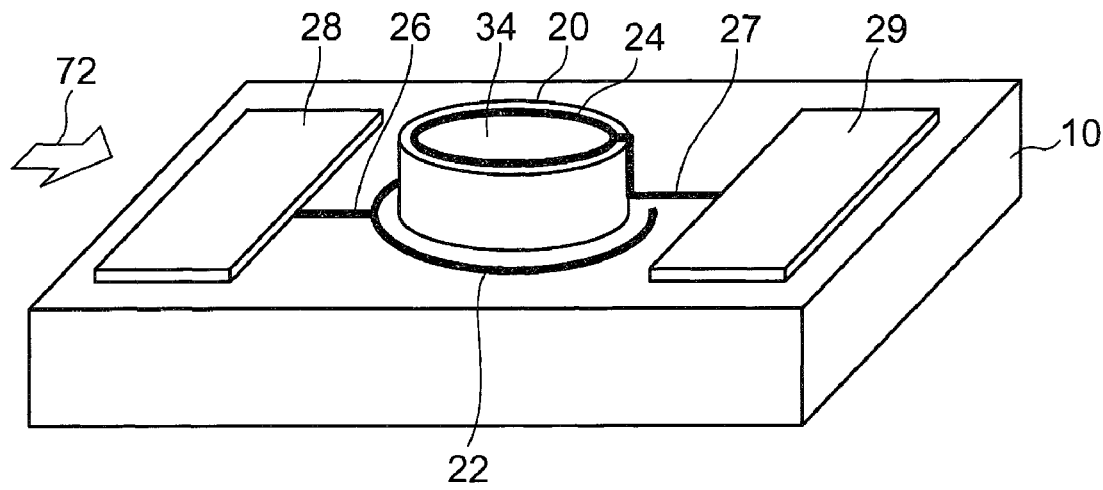
FIG. 15 is a schematic perspective view of a light receiving element as a comparative example.

FIG. 15 is a schematic perspective view of a light receiving element as a comparative example. A mesa 20 is placed on a substrate 10. A second electrode 24 is provided on the upper face 34 of the mesa 20. A first electrode 22 is provided on a semiconductor layer of the first conductivity type (not shown) around the mesa 20. A first pad 28 and a second pad 29 are provided on the substrate 10, and are connected to the first electrode 22 and the second electrode 24 via interconnections 26 and 27, respectively. Other interconnections (not shown) are connected to the first pad 28 and the second pad 29, and electric signals can be read from the light receiving element into a control unit (not shown) through the interconnections, for example. In this comparative example, light 72 emitted from the light emitting element 62 travels from the direction of the first pad 28. As a result, part of the emitted light 72 is scattered by the interconnections connected to the first pad 28.

Figure 16:
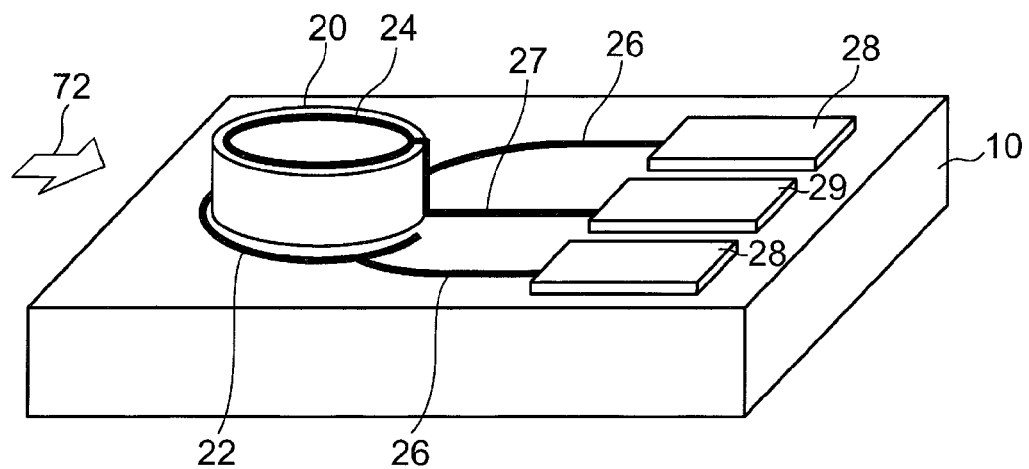
FIG. 16 is a schematic perspective view of a light receiving element in accordance with a seventh embodiment of the present invention.

FIG. 16 is a schematic perspective view of a light receiving element in accordance with a seventh embodiment of the present invention. A second electrode 24 is provided on the upper face of a mesa 20 of the light receiving element. A first electrode 22 is provided around the mesa 20. Interconnections 26 and 27 are connected to the first electrode 22 and the second electrode 24, and extend to the outside of the light receiving face. First pads 28 and a second pad 29 (electrode pads) are connected to the interconnections 26 and 27. This embodiment differs from the comparative example shown in FIG. 15 in that the first pads 28 and the second pad 29 are placed on the opposite side of the mesa 20 of the light receiving element from the light emitting element 62. Unlike the comparative example, this embodiment does not have the emitted light 72 scattered by the interconnection, and can further increase the sensitivity of the light receiving element 60 with respect to the emitted light 72.

Also, the first pads 28 are provided on both sides of the second pad 29. As the interconnections 26 should be connected to either one of the first pads 28, each interconnection connected to the first pads 28 and the interconnection connected to the second pad 29 can be prevented from crossing each other, regardless of the positions of the pads on the package side of the optical semiconductor module.

Eighth Embodiment

Figure 17:
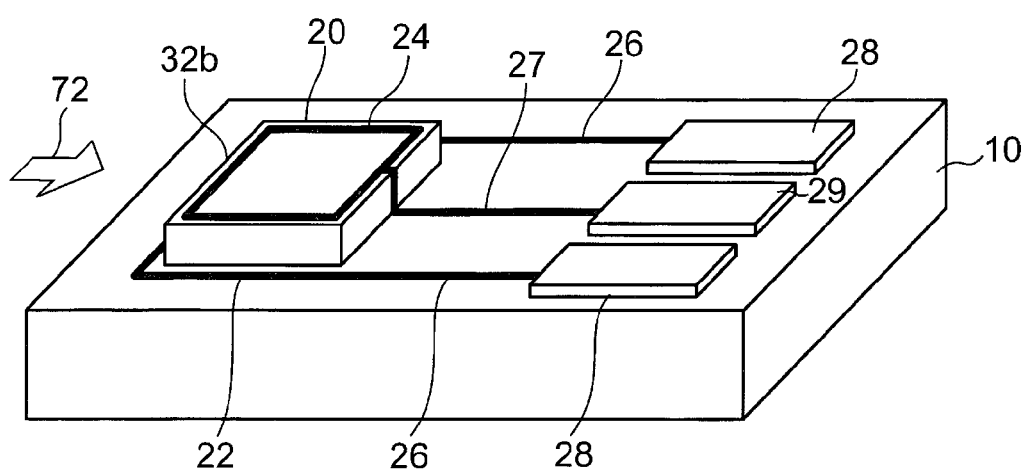
FIG. 17 is a schematic perspective view of a light receiving element in accordance with an eighth embodiment of the present invention.

FIG. 17 is a schematic perspective view of a light receiving element in accordance with an eighth embodiment of the present invention. This light receiving element shown in FIG. 17 differs from the light receiving element shown in FIG. 16 in that a mesa 20b has a shape of a quadrangular prism. Therefore, a side face 32b is a flat surface. With this arrangement, emitted light 72 enters through the side face 32b. Thus, the sensitivity of the light receiving element 60 with respect to the emitted light 72 can be made even higher. Among the side faces of the mesa 20b, the side face through which the emitted light 72 enters should be a flat surface, and each of the other side faces may have a curved surface.

In the first through eighth embodiments, the light emitting element 62 and the light receiving element 60 may be mounted directly on the package 50. In other words, the package 50 may also serve as the mounting unit on which the light emitting element 62 and the light receiving element 60 are to be mounted directly. Also, in the above described embodiments, the semiconductor layer 12 of the first conductivity type is of the n-type, and the semiconductor layer 16 of the second conductivity type is of the p-type. However, the semiconductor layer 12 of the first conductivity type and the semiconductor layer 16 of the second conductivity type should only have the opposite conductivity types. Accordingly, the semiconductor layer 12 of the first conductivity type may be of the p-type, and the semiconductor layer 16 of the second conductivity type may be of the n-type.

In the first through eighth embodiments, mesa-type photodiodes have been described as light receiving elements. However, the present invention may also be applied to other types of light receiving elements, such as p-i-n photodiodes and avalanche photodiodes (APD).

Although a few preferred embodiments of the present invention have been shown and described, it would be appreciated by those skilled in the art that changes may be made in these embodiments without departing from the principles and spirit of the invention, the scope of which is defined in the claims and their equivalents.

The present application is based on Japanese Patent Application No. 2007-086131 filed Mar. 29, 2007, the entire disclosure of which is hereby incorporated by reference.

What is claimed is:

1. An optical semiconductor module comprising:
   a light emitting element;
   a light receiving element that is a mesa-type photodiode and has a light receiving face on an upper face and a side face of a mesa of the light receiving element, with an antireflection film being formed directly on the upper face and the side face; and
   a mounting unit that has the light emitting element and the light receiving element mounted thereon with such a positional relationship that light emitted from the light emitting element is optically connected at least on the light receiving face of the side face of the light receiving element, wherein:
   the light receiving element has a light absorption layer, a semiconductor layer of a first conductivity type, and a semiconductor layer of a second conductivity type, the light absorption layer being interposed between the semiconductor layer of the first conductivity type and the semiconductor layer of the second conductivity type; and at least the semiconductor layer of the second conductivity type and the light absorption layer extend on to the side face so that light incident on the light absorption layer through both of the upper face and the side face is converted into electric signal.

2. The optical semiconductor module as claimed in claim 1, wherein the light emitting element and the light receiving element are mounted on the same plane of the mounting unit.

3. The optical semiconductor module as claimed in claim 1, wherein the upper face of the light receiving element is at a lower level than an upper face of the light emitting element.

4. The optical semiconductor module as claimed in claim 1, further comprising
a reflection film that is placed on another side face on the opposite side from the side face of the light receiving element facing the light emitting element.

5. The optical semiconductor module as claimed in claim 1, wherein the side face of the light receiving element has a flat surface.

6. The optical semiconductor module as claimed in claim 1, wherein
the optical semiconductor module further comprises a first pad and a second pad that are placed on the opposite side of the light receiving element across the light receiving face of the light receiving element, and are respectively connected to the semiconductor layer of the first conductivity type and the semiconductor layer of the second conductivity type.

7. The optical semiconductor module as claimed in claim 6, wherein at least one of the first pad and the second pad is provided on either side of the other one of the first pad and the second pad.

8. The optical semiconductor module as claimed in claim 3, wherein the light receiving element has side faces in a reversed mesa shape.

9. The optical semiconductor module as claimed in claim 4, wherein the reflection film is made of one of $SiO_2/TiO_2$, TiON, Si, Au, Ag, and AuGe.

10. The optical semiconductor module as claimed in claim 1, wherein the antireflection film is a multilayer film.

11. A light receiving element that monitors light emitted from a light emitting element,
the light receiving element that is a mesa-type photodiode comprising:
a light receiving face that is formed on an upper face and a side face of a mesa of the light receiving element, and has an antireflection film formed directly on the upper face and the side face, wherein:
the light receiving element has a light absorption layer, a semiconductor layer of a first conductivity type, and a semiconductor layer of a second conductivity type, the light absorption layer being interposed between the semiconductor layer of the first conductivity type and the semiconductor layer of the second conductivity type; and
at least the semiconductor layer of the second conductivity type and the light absorption layer extend on to the side face so that light incident on the light absorption layer through both of the upper face and the side face is converted into electric signal.

12. The light receiving element as claimed in claim 11, wherein side faces of the light receiving element are formed in a reversed mesa shape.

13. The light receiving element as claimed in claim 11, further comprising
a reflection film that is formed on a side face of the light receiving element other than the side face placed in the light receiving face.

14. The light receiving element as claimed in claim 11, further comprising:
an electrode that is formed on the upper face of the light receiving element;
an interconnection that is connected to the electrode, and extends to the outside of the light receiving face; and
an electrode pad that is connected to the interconnection.

15. The light receiving element as claimed in claim 11, wherein the side face is a primary receiving face of incident light.

16. The light receiving element as claimed in claim 13, wherein the reflection film is made of one of $SiO_2/TiO_2$, TiON, Si, Au, Ag, and AuGe.

* * * * *